United States Patent [19]

Bynum

[11] Patent Number: 4,521,737
[45] Date of Patent: Jun. 4, 1985

[54] BIPOLAR-MOS CURRENT AMPLIFIER HAVING ACTIVE TURN-OFF CIRCUITRY

[75] Inventor: Byron G. Bynum, Tempe, Ariz.

[73] Assignee: Motorola, Inc., Schaumburg, Ill.

[21] Appl. No.: 582,357

[22] Filed: Feb. 22, 1984

[51] Int. Cl.³ .............................................. H03F 3/16
[52] U.S. Cl. ..................................... 330/51; 330/277; 330/288; 330/290; 330/293; 330/298; 330/300
[58] Field of Search ...................... 330/51, 207 P, 277, 330/288, 290, 293, 298, 300; 323/315, 316; 307/571, 572, 577, 580, 581, 583, 584

[56] References Cited

U.S. PATENT DOCUMENTS 4,485,352 11/1984 Davies et al. ...................... 330/288

Primary Examiner—James B. Mullins
Attorney, Agent, or Firm—Michael D. Bingham

[57] ABSTRACT

An integrated current amplifier circuit combining bipolar and MOS technologies provides accurate current gain over a wide voltage supply range. The amplifier circuit includes a current source for providing first and second currents and first and second resistive circuits coupled to the current source for sinking the respective currents supplied therefrom. A feedback transistor connected between the current source and an output of the amplifier circuit provides current feedback to the first resistive circuit to establish the current gain action of the amplifier circuit which becomes a ratio of two resistors times an input current supplied to the second resistive circuit. The ratio of the two resistors can be accurately controlled thereby controlling the current gain of the amplifier circuit. Additionally, an active turn-off circuit requiring no standby bias current is provided to ensure that the feedback transistor is non-conducting when the amplifier is in an off state.

7 Claims, 1 Drawing Figure

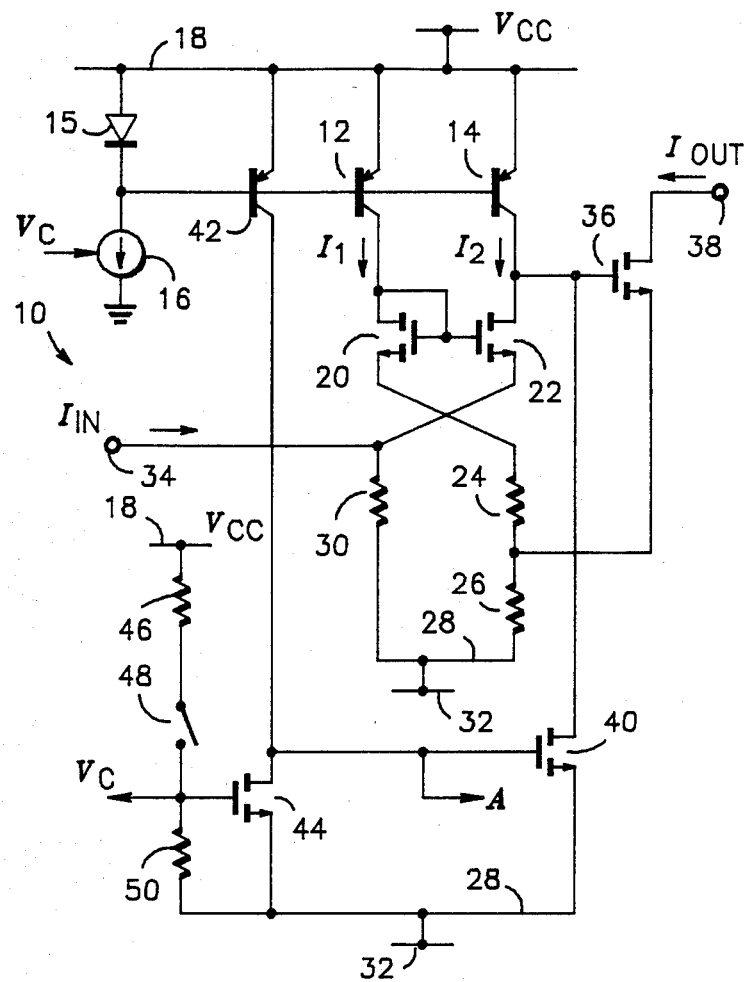

BIPOLAR-MOS CURRENT AMPLIFIER HAVING ACTIVE TURN-OFF CIRCUITRY

BACKGROUND OF THE INVENTION

The present invention relates to integrated circuit amplifiers and, more particularly, to an integrated current amplifier circuit which combines bipolar and MOS circuit technology.

There are many applications which require combined accurate current amplification and a high impedance output. In addition, such applications can require a current amplification circuit that must operate over a wide voltage supply range, for example, 2-to-125 volts while maintaining accurate current amplification. One such application may be for use in today's automotive systems wherein it is desired to provide a low impedance series switch between the automobile's battery and downstream electronics.

Because of problems peculiar to the automotive industry, automotive manufacturers specify that the electronics must operate with a battery voltage of as low as four volts and as high as twenty-four volts while withstanding short voltage transients of ±125 volts. Under high voltage transients the battery must be disconnected from the electronics, which are typically integrated circuits, by an overvoltage protection scheme. This, overvoltage protection scheme must exhibit a low impedance path between the battery and the downstream electronics to enable operation thereof under the aforesaid low battery conditions. One method for providing overvoltage protection having the above described characteristics might be to design an integrated circuit having a high voltage, series-pass PNP transistor which would have its emitter-collector path coupled between the automobile's battery terminal and electronics. Control circuitry could then be coupled to the base of the PNP transistor to control its conduction. Hence, in response to high voltage transients, the control circuitry would turn-off the series-pass transistor to protect the downstream electronics. Under low voltage conditions, the PNP transistor provides a minimum voltage drop between the battery terminal and the downstream electronics to allow operation thereof Among other requirements, the aforedescribed control circuitry must also provide accurate current gain to control the base current drive of the series-pass PNP transistor. Thus, a need exists for an accurate current gain amplifier.

In order to provide the above, the present invention contemplates combining bipolar PNP high voltage transistor, high voltage DMOS field effect transistor and low voltage NMOS field effect transistor technology.

Accordingly it is an object of the present invention to provide an improved current amplifier circuit.

Still another object of the present invention is to provide an improved integrated current amplifier circuit.

A further object of the present invention is to provide a current amplifier comprising a bipolar and MOS integrated circuit transistors.

A still further object of the present invention is to provide a BIMOS current amplifier integrated circuit having a constant amplification factor.

An additional object of the present invention is to provide a current amplifier having an active turn off scheme for ensuring that no current is produced at the output of the amplifier when the amplifier is suppose to be in an off state.

SUMMARY OF THE INVENTION

In accordance with the above and other objects, there is provided an amplifier circuit suited to be fabricated in integrated circuit form comprising a current source for providing first and second currents, a first resistive circuit for sinking the first current and a second resistive circuit for sinking the second current wherein the second resistive circuit is coupled to an input of the amplifier at which is supplied an input current and a feedback circuit that is coupled between the current source and the first resistive circuit as well as to an output of the amplifier for both equalizing the first and second currents when the amplifier is in a quiescent state and establishing a current gain factor for the amplifier in order to provide an amplified current at the output of the amplifier. In addition an MOS active turn-off circuit is provided on board to inhibit the feedback circuit from being rendered conductive whenever the amplifier is turned off due to voltage transients that may occur on the voltage supply line of the amplifier.

BRIEF DESCRIPTION OF THE DRAWING

The sole FIGURE is a schematic diagram of the current amplifier circuit of the preferred embodiment.

DETAILED DESCRIPTION OF THE PREFERRED EMBODIMENT

Turning to the sole FIGURE, there is illustrated current amplifier 10 of the present invention. Amplifier 10 is suited to be manufactured in integrated circuit form and includes a pair of PNP transistors 12 and 14 having respective base electrodes biased by diode 15 and controlled current source 16, and emitter electrodes coupled to power supply conductor 18 at which is supplied a source of operating potential $V_{CC}$. Transistor 12 is biased to source a current $I_1$ at its collector to the drain of NMOS field effect transistor 20 which, as illustrated, is connected as a diode. The gate of NMOS transistor 20 is connected to the gate of NMOS transistor 22 which sinks a current $I_2$ that is sourced at the collector of transistor 14 to its drain. In general, transistors 12, 14 and 20, 22 are matched devices whereby the currents $I_1$ and $I_2$ are of equal magnitude. Hence, these interconnected transistors function as a current source for supply first and second currents at the respective source electrodes of transistors 20 and 22.

The source electrode of transistor 20 is connected to a first resistive circuit comprising resistors 24 and 26 which are series coupled therebetween to power supply conductor 28. Similarly, the source electrode of transistor 22 is connected to a second resistive circuit comprising resistor 30 to power supply conductor 28. Power supply conductor 28 is coupled to terminal 32 at which is applied a ground reference potential. The interconnection between resistor 30 and the source of transistor 22 is coupled to input 34 of current amplifier 10 at which is supplied a source of input current $I_{in}$ during operation thereof.

DMOS field effect transistor 36, having its drain and source electrodes coupled between output terminal 38 and the interconnection between resistors 24 and 26, provides feedback as will be explained. The gate of transistor 36 is connected to the drain of transistor 22. In a quiescent operating condition, with output terminal 38 connected to a load (not shown), DMOS transistor 36 provides feedback current through resistor 26 which will substantially equalize the gate-to-source voltages of transistors 20 and 22 since quiescent equilibrium requires these transistors to conduct equal currents $I_1$ and $I_2$. If currents $I_1$ and $I_2$, or transistors 20 and 22, or said resistor circuits are not matched due to process tolerances, the circuit will reach quiescent in one of two states. Assuming the sum of the value of resistors 24 and 26 is equal to the value of resistor 30 and current $I_1$ equals current $I_2$, the voltages developed at the source electrodes of transistors 20 and 22 will be equal and transistor 36 need not be conductive to produce circuit equilibrium which is one equilibrium state. However, if for example current $I_2$ is greater than $I_1$ the voltage developed across resistor 30, which appears at the source of transistor 22, will be greater than the voltage developed across resistors 24 and 26 appearing at the source of transistor 20. Thus, transistor 36 will be rendered more conductive as its gate electrode is therefore at some positive voltage which will produce a feedback current through the transistor to be sourced to resistor 26. This action raised the voltage at the source electrode of transistor 20 thereby raising the gate voltages of transistors 20 and 21 until transistor 22 sinks the larger current $I_2$. This condition with transistor 36 conducting is the second equilibrium state.

In normal operation, with an input current $I_{IN}$ supplied to input 34, an output current $I_{OUT}$ is produced at output 38 equal to:

$$I_{OUT} = I_{IN}(R30/R26)$$

where R30 is the value of resistor 30 and R26 is the value of resistor 26. From the above it is seen that the current gain of amplifier 10 is set by the ratio of the value of resistors 30 and 26.

It should be understood that NMOS transistors 20 and 22 as well as DMOS transistor 36 could be replaced by equivalent bipolar NPN transistors and amplifier 10 will function as aforedescribed. Likewise, the transistors could be replaced with their complimentary conductive type transistors, i.e., PNP transistors 12 and 14 becoming NPN transistors with the NPN transistors being replaced by PNP transistors as is understood.

Current amplifier 10 may, for example, be utilized as a portion of a control circuit for protecting control electronics in an automobile environment as has been previously mentioned. In this application, a series-pass PNP transistor may be utilized with its emitter-collector path coupled between the battery of the automobile and the downstream control electronics. The base of the series-pass transistor would be coupled to output 38 whereby the conduction thereof is controlled by current amplifier 10. Hence, under high voltage transients, the series-pass transistor would be turned-off by turning off current amplifier 10 to protect the control electronics. Therefore, it is important that turn-off of amplifier circuit be guaranteed by positively inhibiting turn-on of transistor 36 when amplifier 10 is supposed to be in an off state and no bias current flowing.

To prevent turn on of transistor 36 due to PNP leakage and transient induced currents that may be produced at the collectors of transistors 12 and 14 which can then affect the load coupled to output 38, an active pull down or turn-off circuit is provided including NMOS transistor 40 which has its drain-source path connected between the gate of transistor 36 and terminal 28. A PNP transistor 42, having its base and emitter coupled in parallel with those of transistor 12 and 14, has its collector coupled to the gate of transistor 40. Thus, any leakage current or transient induced currents which are produced at the collectors of transistors 12 and 14 will similarly affect transistor 42 to thereby turn on transistor 40. This will inhibit turning on of transistor 36 when current amplifier is supposed to be in an off-state.

During normal operation, with power supplied to amplifier circuit 10, a switching circuit comprising NMOS transistor 44 is activated to sink the current sourced from transistor 42 via the drain-source path thereof to terminal 28. This pulls down the gate of transistor 40 turning it off so that it has no effect during normal operation. Transistor 44 is rendered conductive as aforedescribed by a command signal, $V_C$, generated at its gate through appropriate circuitry that is schematically illustrated as including switch 48 and resistors 46 and 48 connected in series between power supply conductors 18 and 28. Thus, during normal operation, switch 48 would be closed to generate a turn-on command signal thereby rendering transistor 44 and current source 16 conductive. However, when amplifier 10 is supposed to be in an off state switch 48 is opened to generate a turn-off command signal thereby rendering transistor 44 and current source 16 non-conductive. The advantage of this turn-off circuit is that no active bias currents are required to activate transistor 40 thereby inhibiting transistor 36 during the off state of amplifier 10. As indicated at A, additional NMOS transistors could be driven therefrom in the manner aforedescribed in conjunction with the operation of transistor 44 to provide active turn-offs to other circuitry if required.

The combination of bipolar and MOS technologies permit integrated current amplifier circuit 10 to operate over a wide voltage supply range while maintaining all epitaxial regions at a potential that is not more than one diode voltage drop below the voltage supply level. This is an important feature of the present invention if the PNP series pass transistor is fabricated in the same integrated circuit as current amplifier 10 and, furthermore, is a vertical device, i.e., the collector being formed in the substrate of the integrated circuit chip and the base being formed in a portion of the epitaxial region thereof. Thus, if any epitaxial region should go more than one diode drop below $V_{CC}$ while the chip substrate is near $V_{CC}$ due to saturation of the PNP series pass transistor the substrate-to-epitaxial regions will become forward bias thereby injecting minority carriers into the epitaxial region. This is highly undesirable. However, by combining high voltage, bipolar, PNP transistors 12 and 14 with low voltage NMOS transistors 20 and 22 to accomplish the current amplifier function all epitaxial regions such as the bases of PNP transistors 12, 14 cannot become substantially forward biased with respect to the substrate region and any small currents injected into the epitaxial regions of transistors 12 and 14 and collected by their collectors will appear as equal additions to currents $I_1$ and $I_2$ in the sole FIGURE and any effects will be neutralized by the feedback circuit action previously described.

Thus, what has been described is a novel current amplifier circuit constructed in integrated circuit form by combining both bipolar and MOS technologies. The current amplifier circuit exhibits accurate gain control over a wide voltage supply range.

I claim:

1. In a circuit including an MOS field effect transistor, a current sourcing PNP transistor that is biased from a power supply conductor for providing pull up current and turn-on of the MOS field effect transistor, a turn-off circuit for inhibiting turn-on of the MOS field effect transistor due to induced leakage currents or voltage transients, comprising:

an additional PNP transistor having base, emitter and collector electrodes, said base and emitter electrodes being coupled in parallel with the base and emitter electrodes of the current sourcing transistor;

a first additional MOS field effect transistor having gate, drain and source electrodes, said gate electrode being coupled to said collector of said additional PNP transistor, said drain electrode being connected to the gate of the MOS field effect transistor, and said source electrode being connected to a circuit node at which is supplied a reference potential, said additional MOS field effect transistor inhibiting turn-on of the MOS field effect transistor when enabled; and switch circuit means coupled to said collector of said additional PNP transistor which is responsive to a circuit turn-on and turn-off command signal for inhibiting and enabling turn-on respectively of said additional MOS field effect transistor.

2. The circuit of claim 1 wherein said switch circuit means includes:

a second additional MOS field effect transistor having a drain electrode connected to said collector electrode of said additional PNP transistor, a source electrode connected to said circuit node, and a gate electrode; and circuit means connected to said gate electrode of said second additional MOS field effect transistor for rendering said second additional MOS field effect transistor conducting in response to said circuit turn-on command signal.

3. In a current amplifier circuit including a current source coupled to a power supply conductor for providing turn on current whenever an operating potential is supplied to the power supply conductor and a circuit responsive to the turn on current for forward biasing an output MOS transistor coupled thereto, an active turn-off circuit for inhibiting turn on of the output MOS transistor due to voltage transients that may occur on the power supply conductor, comprising:

a transistor of a first conductivity type having base, emitter and collector electrodes, said base and emitter electrodes being coupled to the power supply conductor;

a MOS transistor of a second conductivity type having gate, source and drain electrodes, said gate electrode being connected to said collector electrode of said transistor, said drain electrode being connected to the gate electrode of the output MOS transistor;

circuit means for connecting said source of said MOS transistor to a reference potential; and switch means connected to said gate electrode of said MOS transistor for rendering said MOS transistor non-conducting in response to a circuit turn-on command signal and for rendering said MOS transistor conducting to thereby inhibit the output MOS transistor in response to a circuit turn-off command signal.

4. The current amplifier circuit of claim 3 wherein said switch means includes:

an additional MOS transistor of like conductivity type as said MOS transistor having gate, drain and source electrodes, said drain electrode being connected to said collector electrode of said transistor, said source electrode being coupled to said circuit means; and means connected to said gate electrode of said additional MOS transistor responsive to said turn-on command signal being supplied to the current amplifier circuit for rendering said additional MOS transistor conducting to thereby render said MOS transistor non-conducting.

5. A current amplifier circuit, comprising:

first and second power supply conductors;

current source means coupled to said first power supply conductor for providing first and second currents in response to an operating potential being supplied to said first power supply conductor;

first resistive circuit means coupled between said current source means and said second power supply conductor for sinking said first current;

a second resistive circuit means coupled between said current source means and said second power supply conductor and to an input of the current amplifier circuit for sinking said second current;

a MOS transistor having gate, source and drain electrodes, said gate electrode being coupled to said current source means, said drain electrode being coupled to an output of the current amplifier circuit and said source electrode being coupled to said first resistive circuit means; and active turn off circuit means coupled to the gate electrode of said MOS transistor for inhibiting said MOS transistor from being rendered conductive in response to a command turn-off signal.

6. The current amplifier circuit of claim 5 wherein said active turn-off circuit includes:

a first additional MOS transistor having gate, source and drain electrodes, said drain electrode being coupled to said gate electrode of said MOS transistor, said source electrode being coupled to said second power supply conductor;

a transistor having base, emitter and collector electrodes, said base and emitter electrodes being coupled to said first power supply conductor, said collector electrode being connected to said gate electrode of said first additional MOS transistor; and semiconductor switch means responsive to a turn-on command signal for inhibiting said first additional MOS transistor from being rendered conducting.

7. The current amplifier circuit of claim 6 wherein said semiconductor switch means includes a second additional MOS transistor having gate, source and drain electrodes, said drain electrode being connected to said collector of said transistor, said source electrode being coupled to said second power supply conductor, said second additional MOS transistor being rendered conductive in response to said turn-on command signal.

\* \* \* \* \*